(12) United States Patent
Baba et al.

(10) Patent No.: US 6,582,993 B1
(45) Date of Patent: Jun. 24, 2003

(54) METHOD OF UNDERFILLING SEMICONDUCTOR DEVICE

(75) Inventors: Shunji Baba, Kawasaki (JP); Kenji Kobae, Kawasaki (JP); Hidehiko Kira, Kawasaki (JP); Norio Kainuma, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/658,996

(22) Filed: Sep. 11, 2000

(30) Foreign Application Priority Data

Dec. 2, 1999  (JP) ............................ 11-342879

(51) Int. Cl.⁷ ............................................. H01L 21/48
(52) U.S. Cl. ...................... 438/118; 438/120; 438/126
(58) Field of Search .................... 438/118, 108, 438/109, 116, 125, 126, 127, 798, 113, 120

(56) References Cited

U.S. PATENT DOCUMENTS 5,851,853 A * 12/1998 Lee et al.
5,906,682 A * 5/1999 Bouras et al.
6,214,635 B1 * 4/2001 Akram et al.
6,214,642 B1 * 4/2001 Chen et al.
6,224,711 B1 * 5/2001 Carden et al.
6,269,999 B1 * 8/2001 Okazaki et al.

FOREIGN PATENT DOCUMENTS

| JP | 3-296461 | * 12/1991 |
| JP | 9-330891 | * 12/1997 |
| JP | 10-50761 | 2/1998 |

* cited by examiner

*Primary Examiner*—Evan Pert
(74) *Attorney, Agent, or Firm*—Armstrong, Westerman & Hattori, LLP (57) ABSTRACT

Prior to setting of a semiconductor device upon the surface of a wiring substrate, the fluid of a light curable reaction resin is supplied from a nozzle to the surface of the wiring substrate. When the predetermined amount of the fluid has been discharged from the nozzle, the fluid within the nozzle is irradiated through a transparent window defined in the nozzle. A hardening reaction is induced in the irradiated segment of the fluid. The reduction in the fluidity can be achieved in the irradiated segment of the fluid. The irradiated segment forms a partition mass in the fluid within the nozzle. A reliable split can thus be achieved between the partition mass and the fluid discharged from the tip end of the nozzle. The split can be utilized to control the supplied amount of the fluid at a higher accuracy.

7 Claims, 10 Drawing Sheets

METHOD OF UNDERFILLING SEMICONDUCTOR DEVICE

BACKGROUND OF THE INVENTION

1. Field of the Invention

The present invention relates to a method of underfilling a semiconductor device such as a flip-chip mounted on the surface of a wiring substrate.

2. Description of the Prior Art

A conventional method of underfilling a semiconductor device comprises, or example, supplying a fluid of an underfill material, such as an ultraviolet (UV) curable reaction resin or a thermosetting resin, on the up-faced surface of a wiring substrate prior to setting of the semiconductor device upon the up-faced surface of the wiring substrate. The semiconductor device is placed on the fluid of the underfill material swelling on the up-faced surface of the wiring substrate. The underfill material is then subjected to a curing treatment while the semiconductor device is urged against the up-faced surface of the wiring substrate. The semiconductor device is thus fixed on the up-faced surface of the wiring substrate. According to this type of method, the space remaining between the set semiconductor device and the tip-faced surface of the wiring substrate is expected to completely he filled with the fluid of the underfill material, without any voids, even if the space gets smaller between the semiconductor device and the wiring substrate.

The supplied amount of the fluid needs to be accurately controlled for the individual semiconductor devices in the aforementioned method of underfilling. If the fluid is supplied too much for a semiconductor device, the fluid is allowed to overflow out of the space between the semiconductor device and the up-faced surface of the wiring substrate. The overflowing fluid may hinder the subsequent treatment or process for the wiring substrate or printed circuit board. To the contrary, if the fluid is not supplied enough, metallic input/output bumps may not be fully contained within the underfill material between the semiconductor device and the wiring substrate. In this case, a wiring pattern on the wiring substrate may not be fully covered with the underfill material between the semiconductor device and the wiring substrate. In any event, exposure of the input/output bumps and the wiring pattern may induce corrosion of the bumps and the wiring pattern, which is not preferable.

In addition, the individual semiconductor devices need to be separately subjected to a curing treatment in the aforementioned method of underfilling. A longer time should be spent for mounting the semiconductor devices on the corresponding wiring substrate. Moreover, the semiconductor device needs to be kept urged against the up-faced surface of the wiring substrate when the fluid of the underfill material is to be cured. A complicated mechanism should be employed in an underfilling apparatus accomplishing the above-mentioned method of underfilling.

SUMMARY OF THE INVENTION

It is accordingly an object of the present invention to provide a method of underfilling a semiconductor device capable of accurately controlling the supplied amount of an underfill material to the utmost, and an underfilling apparatus for a semiconductor device capable of realizing the same method.

It is another object of the present invention to provide a syringe, a printed circuit board and a method of preliminary treatment all designed to contribute to an accurate control of the supplied amount of the underfill material.

It is a further object of the present invention to a method of underfilling, a semiconductor device capable of employing an underfilling apparatus of a relatively simplified structure even if an underfill material is supplied to the surface of a wiring substrate prior to setting of the semiconductor device on the surface of the wiring substrate.

According to a first aspect of the present invention, there is provided a method of underfilling a semiconductor device, comprising: supplying a fluid of a reaction resin from a nozzle toward a surface of a wiring substrate prior to setting of the semiconductor device upon the surface of the wiring substrate; and reducing a fluidity of the fluid within the nozzle when a predetermined amount of the fluid has been discharged.

When the fluidity of the fluid is reduced in the nozzle, a partial fluid of the reduced fluidity can be obtained to define a partition mass or segment in the fluid within the nozzle. A reliable split can thus be achieved between the partition mass and the fluid discharged from the tip end of the nozzle. The split can be utilized to control the supplied amount of the fluid at a higher accuracy. The reaction resin may include a light curable reaction resin which is hardened by radiation of alight, a thermosetting resin which is hardened by heat, and the other types of reaction resins.

According to a second aspect of the present invention, there is provided a method of underfilling a semiconductor device, comprising: supplying a fluid of a light curable reaction resin from a nozzle toward a surface of a wiring substrate prior to setting of the semiconductor device upon the surface of the wiring substrate; and irradiating the fluid of the light curable reaction resin through a transparent window defined in the nozzle when a predetermined amount of the fluid has been discharged.

When the fluid within the nozzle is irradiated through the transparent window, a hardening reaction is induced in the irradiated segment of the fluid. The reduction in the fluidity can be achieved in the irradiated segment of the fluid. The irradiated segment forms a partition mass in the fluid within the nozzle in the aforementioned manner. A reliable split can thus be achieved between the partition mass and the fluid discharged from the tip end of the nozzle. The split can be utilized to control the supplied amount of the fluid at a higher accuracy. The ultraviolet ray curable reaction resin may include one which is hardened by independent radiation of an ultraviolet ray, one which is hardened by radiation of an ultraviolet ray in combination with heat, and the like.

For example, the aforementioned method may employ a syringe comprising: an opaque nozzle having a port at the tip end; an opaque container connected to the root end of the nozzle and containing a fluid of a light curable reaction resin; and a transparent window defined in the nozzle. The syringe is allowed to discharge the fluid of the light curable reaction resin from the port at the tip end in response to a pressure or the like applied to the container. When the window is irradiated, the fluidity of the fluid can be reduced in response to the irradiation in the aforementioned manner.

In place of the above-described syringe, a conventional syringe can be employed which comprises an opaque nozzle having a port at the tip end and an opaque container connected to the root end of the nozzle and containing a fluid of a light curable reaction resin, as conventionally known. In this case, a tube attachment may be coupled to the tip end of the nozzle. A transparent window is defined in the tube attachment. The fluid discharged from the nozzle is designed to pass through the tube attachment so as to flow out of the tip end of the tube attachment. When the fluid within the tube attachment is irradiated through the transparent window, the reduction in the fluidity can be achieved in the irradiated segment of the fluid in the aforementioned manner. The attachment is adapted to achieve reduction in the fluidity of the fluid without re-designing the structure of conventional syringes.

In addition, the aforementioned method may employ an underfilling apparatus for a semiconductor device, comprising: a table; a support head opposed to the table; a positioning mechanism connected to the support head so as to induce movement of the support head toward a discharge position; a dispenser connected to the support head so as to supply a pressure to the support head, and a light source designed to irradiate a predetermined irradiation area defined between the support head at the irradiation position and the table. The aforementioned syringe can be mounted on or attached to the support head in the underfilling apparatus. The fluid of the light curable reaction resin is allowed to flow out of the nozzle with the assistance of pressure supplied to the support head from the dispenser. The reduction in the fluidity can be achieved by positioning the transparent window right at the discharge position. The positioning mechanism is employed to position the transparent window.

It is preferable that the underfilling apparatus further comprises a mask member designed to block a ray of light headed toward the table. The mask member serves to prevent the fluid from being hardened immediately after the discharge from the tip end of the nozzle.

According to a third aspect of the present invention, there is provided a method of underfilling a semiconductor device, comprising: holding the semiconductor device against a down-faced surface of a wiring substrate so as to cover with the semiconductor device over a discharge opening defined in the wiring substrate; irradiating the down-faced surface of the wiring substrate; and supplying a fluid of a light curable reaction resin into the discharge opening through an entrance defined on an up-faced surface of the wiring substrate during irradiation.

The fluid introduced into the discharge opening is received against the semiconductor device. The fluid is allowed to spread in the space between the semiconductor device and the down-faced surface of the wiring substrate. The overflowing fluid can be subjected to the irradiation so that the overflowing fluid gets hardened at the outer periphery of the semiconductor device. The flow of the fluid can be blocked by the hardened light curable resin. The fluid can be restrained from excessive spread off the semiconductor device.

For example, the aforementioned method of underfilling may employ an underfilling apparatus comprising: a support head designed to reach a discharge position; a dispenser connected to the support head so as to supply a pressure to the support head; and a light source disposed below the support head at the discharged position so as to irradiate upward. The aforementioned syringe can be mounted on or attached to the support head. The syringe is only required to comprise an opaque nozzle having a port at the tip end and an opaque container connected to the root end of the nozzle and containing a fluid of a light curable reaction resin, as conventionally known.

Furthermore, according to a fourth aspect of the present invention, there is provided a printed circuit board comprising: conductive input/output pads arranged over an underfill receiving region defined on a surface of a wiring substrate; a first discharge opening defined in the wiring substrate at a dense area where the input/output pads are congested; and a second discharge opening defined in the wiring substrate at a sparse area where the input/output pads are scattered, said second discharge opening designed to spread over an area larger than that of the first discharge opening.

In general, when a semiconductor device is to be mounted on a wiring substrate, conductive bumps on the semiconductor device is received on the corresponding conductive input/output pads on the wiring substrate. In other words, the density of the conductive bumps depends on the density of the input/output pads. If the input/output pads, namely, the conductive bumps are congested, like the dense area, the fluid of the underfill material smoothly flows through a smaller space between the semiconductor device and the surface of the wiring substrate. The transfer of the fluid can be accelerated between the adjacent conductive bumps. On the other hand, even if the conductive bumps are scattered, like the sparse area, the second discharge opening of a larger area serves to accelerate the transfer of the fluid in the space between the semiconductor device and the wiring substrate without support of the conductive bumps. The first and second discharge openings may be continuous to form a single opening.

Furthermore, according to a fifth aspect of the present invention, there is provided a method of preliminary treatment for an underfill, comprising subjecting an underfill receiving region on a surface of a wiring substrate to irradiation of a plasma.

The ray of the plasma serves to clean up the surface of the wiring substrate so as to improve the wetness of the underfill receiving region. The improved wetness allows the fluid of the underfill material to smoothly spread over the surface of the wiring substrate. If the surface force can be set larger than the interfacial force of the fluid on the surface of the wiring substrate at the area surrounding the underfill receiving region, the fluid can reliably be prevented from spreading beyond the outer periphery of the underfill receiving region.

Furthermore, according to a sixth aspect of the present invention, there is provided a method of mounting a semiconductor device, comprising: supplying a fluid of a reaction resin on a surface of a wiring substrate; placing the semiconductor device on the fluid of the reaction resin over the surface of the wiring substrate: contacting an ultrasonic vibrator against the semiconductor device on the surface of the wiring substrate; and subjecting the fluid of the reaction resin to a curing treatment.

When the semiconductor device is to be mounted on the wiring substrate, an ultrasonic vibration is transmitted from the ultrasonic vibrator to the semiconductor device on the wiring substrate. The semiconductor device may be allowed to vibrate along the surface of the wiring substrate at a higher speed by a fine amplitude. The fine vibration of the semiconductor device along the surface of the wiring substrate serves to induce a frictional heat at the contact between conductive bumps on the semiconductor device and corresponding input/output pads on the wiring substrate. The frictional heat causes the bonding between the conductive bumps and the corresponding input/output pads. The semiconductor device is thus fixed on the wiring substrate. If the fluid of the reaction resin can be subjected to a common or single curing treatment after all the semiconductor devices have been mounted on the wiring substrate, the process can remarkably be facilitated. It leads to a shortened duration of the process. Moreover, after the fixation of the semiconductor on the wiring substrate, the fluid of the reaction resin can be cured and hardened without keeping urging the semiconductor device against the wiring substrate, so that a relatively simplified structure can be employed in an underfilling apparatus or a mounter. It should be noted that the reaction resin may include a light curable reaction resin which is hardened by irradiation, a thermosetting resin which is hardened by heat, and the other types of reaction resins.

It is preferable that a thin film is disposed between the semiconductor device and ultrasonic vibrator when the ultrasonic vibrator is contacted against the semiconductor device in the aforementioned method of mounting. When the ultrasonic vibrator contacts the semiconductor device in the above-described manner, the thin film is interposed between the ultrasonic vibrator and the semiconductor device. Accordingly, the thin film is allowed to catch the overflowing fluid of the reaction resin around the semiconductor device. The ultrasonic vibrator is reliably prevented from being adhered by the fluid of the reaction resin. The ultrasonic vibrator is allowed to keep a larger contact area against the semiconductor device. A reliable transmission of the ultrasonic vibration can be maintained between the ultrasonic vibrator and the semiconductor device in every operation.

In place of the employment of the thin film, a flange formed at the outer periphery of the semiconductor device may be employed to prevent the fluid of the reaction resin from adhering to the semiconductor device. The flange is designed to define a stepped surface opposed to the surface of the wiring substrate. The stepped surface of the flange serves to catch the fluid of the reaction resin overflowing out of the space between the semiconductor device and the wiring substrate. The fluid hardly flows around the flange toward the ultrasonic vibrator. In this manner, the ultrasonic vibrator can be prevented from being adhered by the overflowing fluid of the reaction resin to the utmost.

A method of producing the above-described semiconductor device may comprise: making a groove of a first width on a surface of a wafer when the semiconductor device is to be cut out from the wafer; and sawing the wafer by a second width smaller than the first width along a bottom of the groove so as to separate the semiconductor device from the wafer. Employment of this method serves to produce the flange at the outer periphery of the semiconductor device in a facilitated manner.

BRIEF DESCRIPTION OF THE DRAWINGS

The above and other objects, features and advantages of the present invention will become apparent from the following description of the preferred embodiment in conjunction with the accompanying drawings, wherein.

DESCRIPTION OF THE PREFERRED EMBODIMENT

Figure 1:
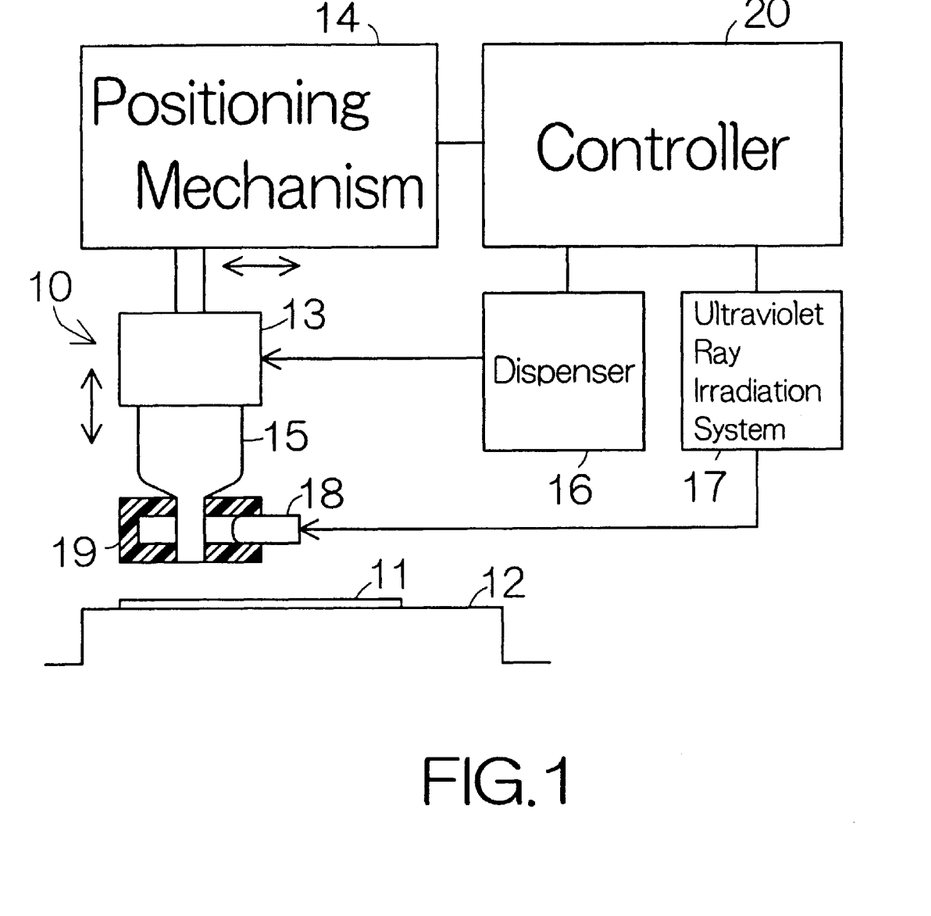
FIG. 1 is a block diagram schematically illustrating the structure of an underfilling apparatus for a semiconductor device according to a first embodiment of the present invention.

FIG. 1 schematically illustrates the entire structure of an underfilling apparatus for a semiconductor device according to a first embodiment of the present invention. The underfilling apparatus 10 includes a table 12 designed to receive a wiring substrate 11 at a horizontal plane, for example, and a support head 13 opposed to the table 12 for movement in accordance with the three-dimensional coordinate system established on the table 12. The coordinate system may be defined by an x-axis and a y-axis extending within the horizontal plane of the table 12 and a z-axis extending in a direction perpendicular to the horizontal plane. The movement of the support head 13 within the coordinate system may be achieved by a positioning mechanism 14, for example. The positioning mechanism 14 may include a combination of guide members for guiding movements of the support head 13 along the x-axis, y-axis and z-axis, respectively, for example.

A syringe 15 is detachably attached to the support head 13. A fluid of an underfill material, such as an ultraviolet ray curable reaction resin, for example, is contained in the syringe 15. The syringe 15 is designed to receive a pressure or a pressurized air from a dispenser 16 which is connected to the support head 13, for example. When the pressurized air is supplied to the syringe 15, the fluid of the ultraviolet ray curable reaction resin within the syringe 15 can be discharged out of the syringe 15 toward the table 12, as described later in detail. The ultraviolet ray curable reaction resin may include one which is hardened by independent radiation of an ultraviolet ray, one which is hardened by radiation of an ultraviolet ray in combination with heat, and so on.

As shown in FIG. 1, an ultraviolet ray irradiation system 17 is connected to the syringe 15. The ultraviolet ray irradiation system 17 is designed to emit an ultraviolet ray from a light source 18 toward the syringe 15. A mask member 19 may be employed to fix the light source 18 to the syringe 15, as is apparent from FIG. 1, for example. The mask member 19 serves to block the ultraviolet ray headed toward the table 12 from the light source 18. Accordingly, the mask member 19 is expected to prevent the ultraviolet ray from reaching the wiring substrate 11 set on the table 12. In addition, integration of the light source 18 with the mask member 19 enables elimination of a positioning mechanism peculiar to the light source 18 for causing the light source 18 to follow the movement of the syringe 15. However, it should be noted that the light source 18 may not be integral to the syringe 15 while separate positioning mechanisms are provided for positioning the syringe 15 and the light source 18 independently. A controller 20 may be connected to the positioning mechanism 14, the dispenser 16 and the ultraviolet ray irradiation system 17 so as to control the operation of the positioning mechanism 14, the dispenser 16 and the ultraviolet ray irradiation system 17, respectively.

Figure 2:
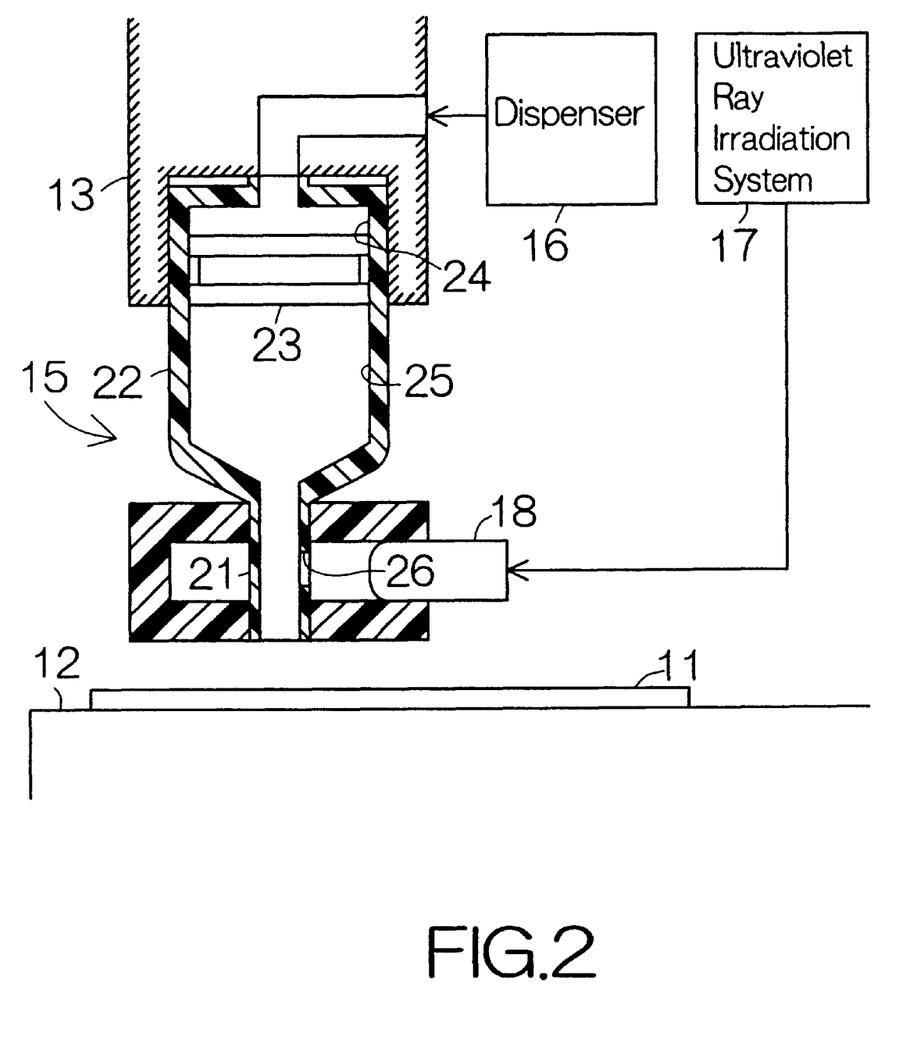
FIG. 2 is a partial sectional view illustrating the structure of a syringe in detail.

As shown in FIG. 2, the syringe 15 includes an opaque nozzle 21 having a discharge port at the tip end, and an opaque container 22 coupled to the root end of the nozzle 21. The nozzle 21 may be integral to the container 22. The container 22 is designed to contain the fluid of the ultraviolet ray curable reaction resin.

A piston 23 is contained within the container 22. The piston 23 is designed to divide the interior space of the container 22 into a pressure chamber 24 leading to the dispenser 16 and a resin chamber 25 leading to the nozzle 21. The fluid of the ultraviolet ray curable reaction resin is stored in the resin chamber 25. When the pressurized air is introduced in the pressure chamber 24 from the dispenser 16, the piston 23 is allowed to advance toward the nozzle 21 so as to discharge the stored fluid out of the discharge port of the nozzle 21 toward the table 12.

Figure 3:
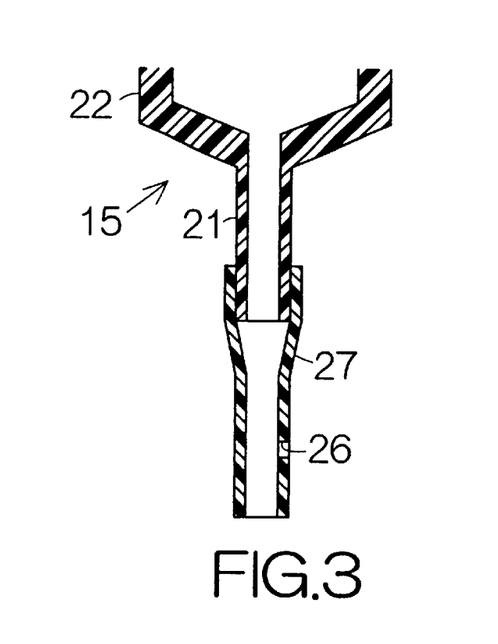
FIG. 3 is a partial sectional view illustrating in detail a tube attachment mounted on the tip end of the syringe.

A transparent window 26 is defined in the nozzle 21. A transparent glass plate, a transparent synthetic resin plate, or the like, for example, may be mounted in the window 26. The transparent window 26 is designed to expose the fluid of the ultraviolet ray curable reaction resin in the nozzle 21 to the ultraviolet ray irradiated from the light source 18 of the ultraviolet ray irradiation system 17. It should be noted that the transparent window 26 need not be formed in the nozzle 21 itself. The transparent window 26 may be formed in a tube attachment 27 coupled to the tip end of the nozzle 21, as shown in FIG. 3, for example.

Figure 4:
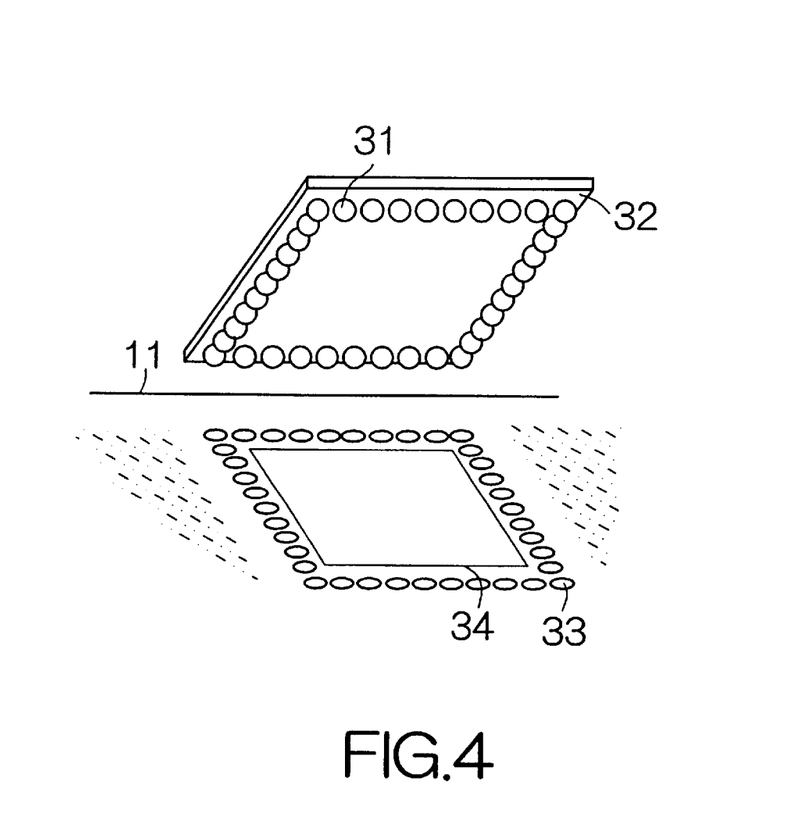
FIG. 4 is a perspective view illustrating a semiconductor device and a part of a wiring substrate.

Next, description will be made of the operation of the underfilling apparatus 10. Assume that a semiconductor device 32 is to be mounted on the wiring substrate 11 as shown in FIG. 4. The semiconductor device 32 may be represented by a flip-chip, for example, comprising spherical gold bumps 31 arranged along the outer periphery of the semiconductor device 32. Conductive input/output pads 33 are correspondingly formed on the wiring substrate 11 so as to receive the respective gold bumps 31. The input/output pads 33 are arranged to surround and define a plain area 34 on the up-faced surface of the wiring substrate 11.

Figure 5A:
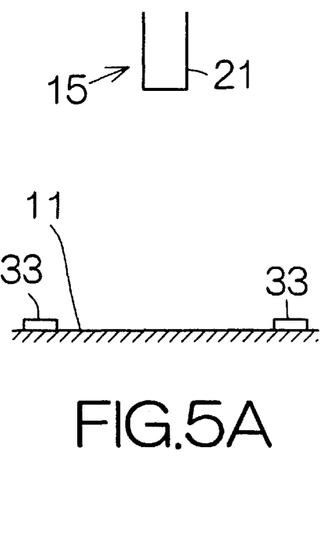
FIGS. 5A to 5D illustrate the process of supplying a fluid of an ultraviolet ray curable reaction resin onto the up-faced surface of the wiring substrate.

When the wiring substrate 11 is placed on the table 12, the support head 13 along with the syringe 15 is positioned relative to the wiring substrate 11, as shown in FIG. 5A. The controller 20 is designed to supply an instructions signal to the positioning mechanism 14 so as to properly position the syringe 15. The instructions signal may include data identifying x- and y-coordinates in accordance with the three-dimensional coordinate system set on the table 12, for example. When the syringe 15 has been positioned at a standby position specified by the x- and y-coordinates in the instructions signal, the tip end of the nozzle 21 is opposed to the center of the plain area 34. The nozzle 21 is kept in an attitude upright to the up-faced surface of the wiring substrate 11.

Figure 5B:
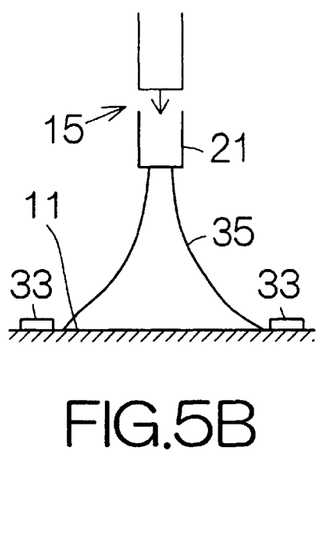

The syringe 15 is then lowered to a discharge position, as shown in FIG. 5B. The controller 20 is designed to supply an instructions signal to the positioning mechanism 14 so as to lower the syringe 15. The instructions signal this time may include data identifying a z-coordinate of the three-dimensional coordinate system. The nozzle 21 is still kept in the attitude upright to the up-faced surface of the wiring substrate 11.

When the syringe 15 has reached the discharge position, the controller 20 instructs the dispenser 16 to start the supply of a pressurized air. The dispenser 16 is designed to discharge the pressurized air under a predetermined pressure toward the syringe 15. The piston 23 advances in the syringe 15 in response to the introduction of the pressurized air into the pressure chamber 24, as shown in FIG. 2, for example. The fluid 35 of the ultraviolet ray curable reaction resin is consequently allowed to flow out of the tip end of the nozzle 21.

The fluid of the ultraviolet ray curable reaction resin discharged from the nozzle 21 is received on the up-faced surface of the wiring substrate 11 at the plain area 34. The discharged or supplied amount of the fluid 35 is determined in accordance with the extent of the plain area 34. The fluid 35 is thus avoided from overflowing the plain area 34 surrounded by the input/output pads 33. The input/output pads 33 are accordingly prevented from being covered with the fluid of the ultraviolet ray curable reaction resin. The supplied amount of the fluid 35 may be controlled by properly setting the level or magnitude of the pressure and the duration of supply for the pressurized air.

Figure 5C:
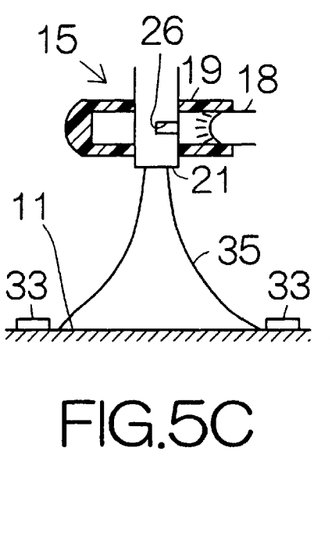

When the supply of the pressurized air has been completed, the controller 20 instructs the ultraviolet ray irradiation system 17 to start radiation of the ultraviolet ray. The ultraviolet ray irradiation system 17 allows the light source 18 to emit the ultraviolet ray toward the syringe 15, as shown in FIG. 5C. The ultraviolet ray is introduced into the interior of the nozzle 21 through the transparent window 26 in the syringe 15.

Figure 5D:
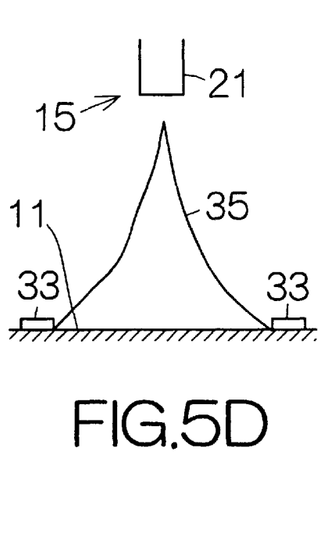

When the radiation of the ultraviolet ray has been completed, the syringe 15 is lifted to the standby position, as shown in FIG. 5D. The controller 20 is designed to supply an instructions signal to the positioning mechanism 14 so as to raise the support head 13. The instructions signal may include data identifying a z-coordinate in the three-dimensional coordinate system in the aforementioned manner. When the syringe 15 is lifted, the tip end of the nozzle 21 is pulled away from the fluid 35 of the ultraviolet ray reaction resin on the wiring substrate 11. In this manner, the fluid 35 is supplied to the up-faced surface of the wiring substrate 11 from the nozzle 21 prior to setting of the semiconductor device 32 upon the wiring substrate 11.

Figure 6A:
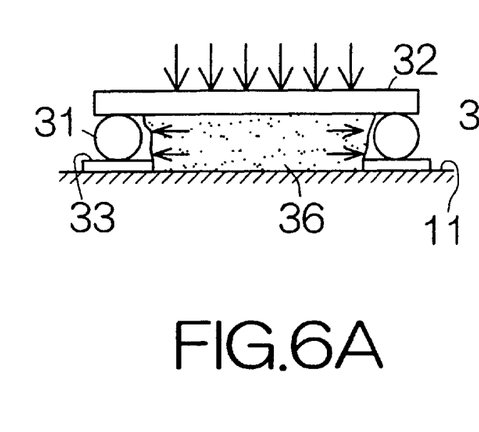
FIGS. 6A and 6B illustrate the process of placing the semiconductor device on the fluid over the wiring substrate.
Figure 6B:
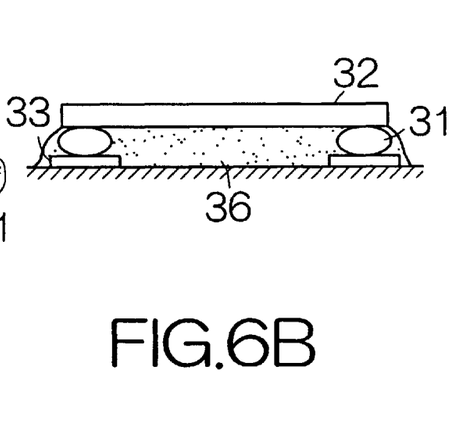

After completion of the supply of the fluid 35, as shown in FIG. 6A, the semiconductor device 32 is placed on the up-faced surface of the wiring substrate 11. The gold bumps 31 of the semiconductor device 32 are foremost received on the corresponding input/output pads 33 on the wiring substrate 11. The semiconductor device 32 is then subjected to an urging force vertical to the up-faced surface of the wiring substrate 11, so that the semiconductor device 32 is urged against the up-faced surface of the wiring substrate 11. The gold bumps 31 are deformed to shrink in the vertical direction. The more the gold bumps 31 are shrunk, the smaller the space gets between the semiconductor device 32 and the wiring substrate 11. The reduction in the space between the semiconductor device 32 and the wiring substrate 11 in this manner causes the fluid 36 of the ultraviolet ray curable reaction resin between the semiconductor device 32 and the wiring substrate 11 to flow outward toward the periphery of the semiconductor device 32. The space between the semiconductor device 32 and the wiring substrate 11 is thus filled with the fluid 36 of the ultraviolet ray curable reaction resin surrounding the gold bumps 31 on the input/output pads 33, as shown in FIG. 6B. The gold bumps 31 are completely embedded within the fluid 36 of the ultraviolet ray curable reaction resin on the input/output pads 33.

Thereafter, an ultraviolet ray is radiated over the ultraviolet ray curable reaction resin on the wiring substrate 11 prior to release of the urging force. When the ultraviolet ray curable reaction resin is accordingly cured or hardened, the semiconductor device 32 can firmly be fixed on the up-faced surface of the wiring substrate 11. The combination of the gold bumps 31 and the input/output pads 33 serves to establish a reliable electric connection between the semiconductor device 32 and the wiring substrate 11. The semiconductor device 32 can be mounted on the wiring substrate 11 in the above-described manner.

Figure 7A:
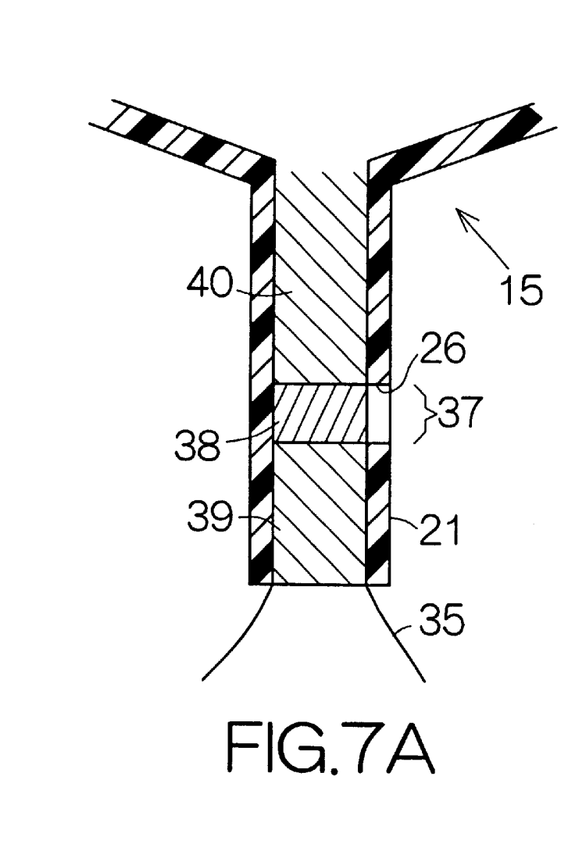
FIGS. 7A and 7B illustrate the function of a transparent window defined in a nozzle of the syringe.

When the ultraviolet ray is emitted from the light source 18 in the aforementioned manner, the hardening reaction of the fluid is induced in the nozzle 21 at the irradiation area 37 of the ultraviolet ray, as shown in FIG. 7A. The hardening reaction causes reduction in the fluidity of the fluid at the irradiation area 37. In other words, the viscosity of the fluid is increased. This partial fluid of the reduced fluidity is utilized to define a partition mass or segment 38 in the nozzle 21. The partition mass 38 serves to divide the fluid within the nozzle 21 into a forefront or downstream fluent segment 39 leading to the fluid 35 discharged from the tip end of the nozzle 21, and a rear or upstream fluent segment 40 leading to the fluid stored in the container 22.

Figure 7B:
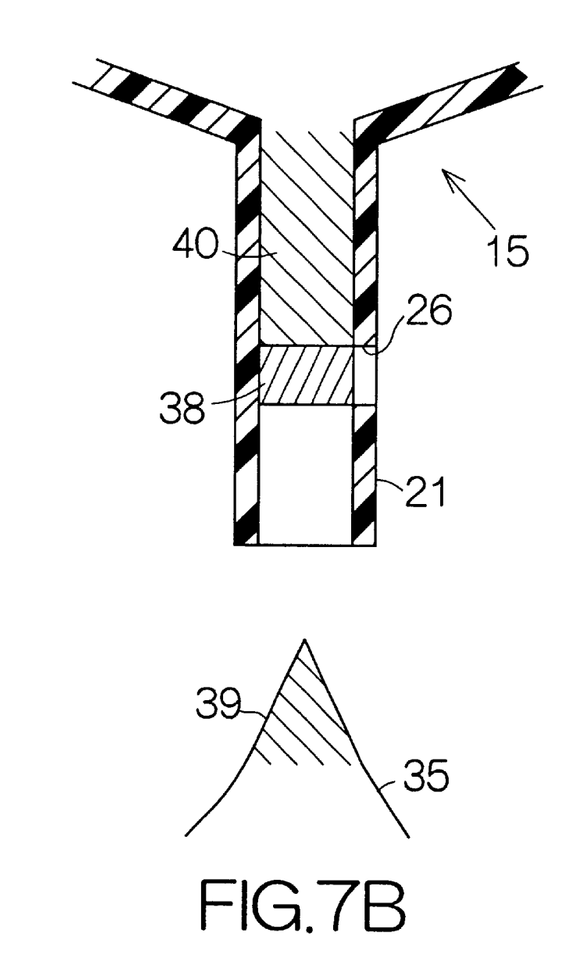

When the syringe 15 is then lifted, as shown in FIG. 7B, the forefront fluent segment 39 is forced to keep continuity to the fluid 35 discharged from the tip end of the nozzle 21. The forefront fluent segment 39 is pulled out of the nozzle 21. On the other hand, the partition mass 38 stays at the position within the nozzle 21. The fluid within the nozzle 21 is accordingly split right at the boundary between the forefront fluent segment 39 and the partition mass 38. The split of the fluid at the constant or uniform position in this manner enables the reliable control of the supplied amount of the fluid 35 discharged from the tip end of the nozzle 21. It has been confirmed that the supplied amount of the fluid 35 cannot be kept constant without the partition mass 38 of higher viscosity. Such variation in the supplied amount may induce an overflow of the excessive fluid of the underfill material out of the space between the semiconductor device 32 and the wiring substrate 11, if the fluid is discharged too much. Otherwise, such variation may induce failure in complete coverage over the gold bumps 31 and the wiring pattern on the wiring substrate 11, if the fluid is not supplied enough.

The establishment of the aforementioned split between the forefront fluent segment 39 and the partition mass 38 can reliably be achieved when the viscosity of the partition mass 38 is set at least one and a half (1.5) times larger than that of the forefront fluent segment 39, in other words, the viscosity of the original fluid prior to radiation of an ultraviolet ray. The fluid may originally have the viscosity of the range between 3,000 cps and 6,000 cps, for example. An excessive increase in viscosity should be avoided, however. If the fluidity of the partition mass 38 is completely lost, the subsequent supply of the fluid may completely be hindered. The fluidity of the partition mass 38 should be taken into account in the determination of the set viscosity. The viscosity of the partition mass 38 can be controlled by properly setting the duration for the radiation of an ultraviolet ray.

It should be noted that the amount of radiation of an ultraviolet ray can be controlled by alternately turning on and of the light source 18 or by alternately opening and closing a shutter, not shown, attached to the transparent window 26, for example.

Figure 8:
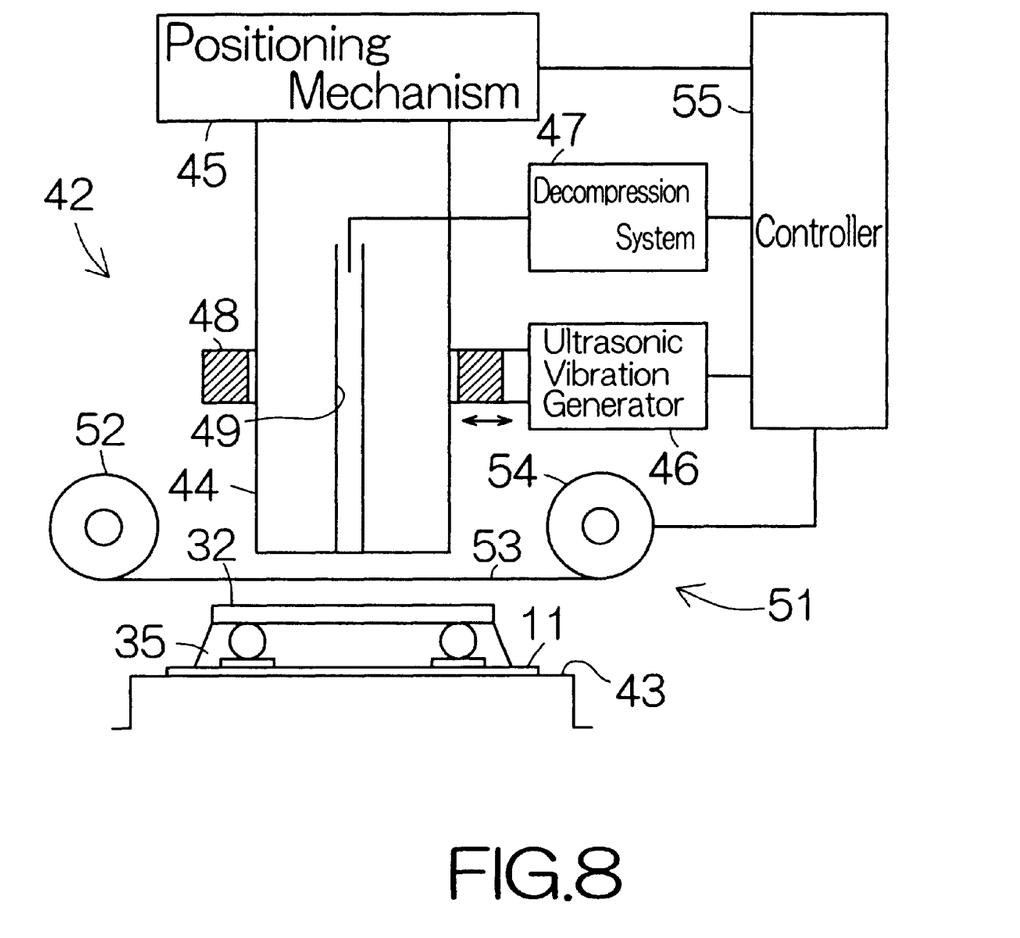
FIG. 8 is a block diagram schematically illustrating the structure of a mounter.

FIG. 8 schematically illustrates the structure of an example of a mounter 42 designed to fix the semiconductor device 32 on the up-faced surface o the wiring substrate 11 on which the fluid of the ultraviolet ray curable reaction resin spreads over to swell. The mounter 42 comprises, for example, a table 43 designed to receive the wiring substrate 11 at a horizontal plane, and an ultrasonic vibrator head 44 opposed to the table 43. A positioning mechanism 45 is assembled in the mounter 42 so as to position the ultrasonic vibrator head 44 relative to the table 43 in the same manner as the aforementioned underfilling apparatus 10.

An ultrasonic vibration generator 46 and a decompression system 47 are connected to the ultrasonic vibrator head 44. The ultrasonic vibration generator 46 is designed to generate an ultrasonic vibration at a vibrator 48. The generated ultrasonic vibration is transmitted to the ultrasonic vibrator head 44. The ultrasonic vibrator head 44 is thus allowed to vibrate in the horizontal or lateral direction at a higher speed by an amplitude of approximately 2 $\mu$m, for example. The decompression system 47 is designed to suck an air from a low pressure passage 49 formed in the ultrasonic vibrator head 44, for example.

A film supplier 51 is disposed between the ultrasonic vibrator head 44 and the table 43. The film supplier 51 comprises a drive roll 54 designed to roll up a thin film tape 53 wound around a follower roll 52. When the drive roll 54 rotates, the thin film tape 53 is allowed to cross the space defined between the ultrasonic vibrator head 44 and the table 43. The thin film tape 53 may be made from a polytetrafluoroethylene (PTFE) material, a polyimide material, or the like. A controller 55 may be connected to the positioning mechanism 45, the ultrasonic vibration generator 46, the decompression system 47 and the film supplier 51 so as to control the operation of the positioning mechanism 45, the ultrasonic vibration generator 46, the decompression system 47 and the film supplier 51.

Figure 9:
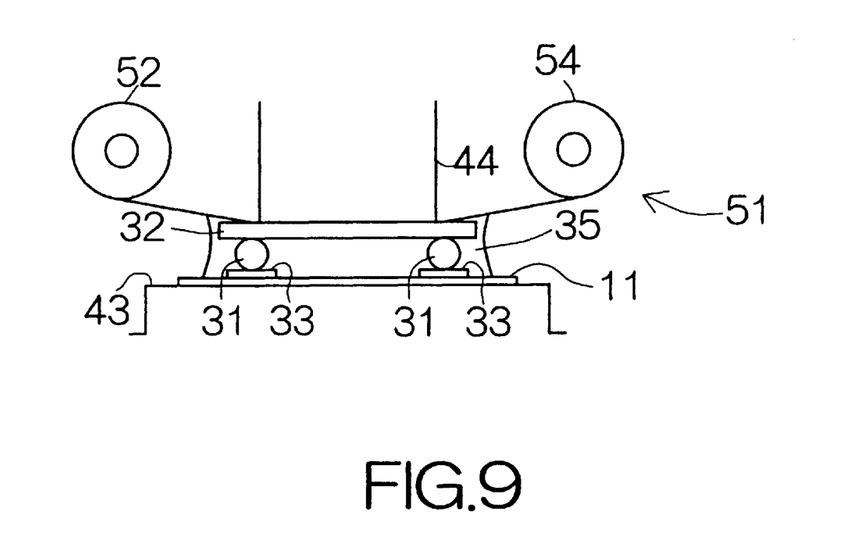
FIG. 9 schematically illustrates the function of a thin film tape in the mounter.

Here, description will be made on the operation of the mounter 42. Assume that the semiconductor device 32 has been placed on the fluid of the ultraviolet ray curable reaction resin over the up-faced surface of the wiring substrate 11, as shown in FIG. 8, for example. The ultrasonic vibrator head 44 is first positioned right above the semiconductor device 32. The ultrasonic vibrator head 44 is then lowered as shown in FIG. 9, until the ultrasonic vibrator head 44 contacts the semiconductor device 32 at the tip or lower end. The controller 55 is designed to output instructions signals to the positioning mechanism 45 so as to properly position and lower the ultrasonic vibrator head 44 in the above-described manner.

The controller 55 subsequently instructs the decompression system 47 to start the suction of air. When the air is sucked from the low pressure passage 49, reduction in pressure is induced in the low pressure passage 49. The semiconductor device 32 is temporarily stuck or adhered on the tip end of the ultrasonic vibrator head 44. Through openings, not shown, are in advance formed in the thin film tape 53 so as to allow the direct contact of the ultrasonic vibrator head 44 against the semiconductor device 32.

After the semiconductor device 32 has been stuck on the ultrasonic vibrator head 44, the controller 55 is designed to instructs the ultrasonic vibration generator 46 to start the generation of an ultrasonic vibration. The generated ultrasonic vibration is transmitted to the ultrasonic vibrator head 44 through the vibrator 48. The ultrasonic vibrator head 44 is allowed to vibrate in the horizontal or lateral direction at a higher speed by a fine magnitude. The horizontal vibration of the ultrasonic vibrator head 44 can reliably be transmitted to the semiconductor device 32. The horizontal fine vibration of the semiconductor device 32 serves to induce a frictional heat at the contact between the gold bumps 31 of the semiconductor device 32 and the corresponding input/output pads 33 on the wiring substrate 11. The frictional heat causes the bonding between the gold bumps 31 and the corresponding input/output pads 33. The semiconductor device 32 can thus be fixed on the wiring substrate 11.

When the gold bumps 31 have completely been bonded on the input/output pads 33, the ultrasonic vibration generator 46 is instructed to stop operating. The decompression system 47 is subsequently instructed to stop operating. The pressure rises in the low pressure passage 49. The semiconductor device 32 is released from sticking to the ultrasonic vibrator head 44. The positioning mechanism 45 is then instructed to lift the ultrasonic vibrator head 44. The operations of the ultrasonic vibration generator 46, the decompression system 47 and the positioning mechanism 45 can be controlled based on instructions signals supplied from the controller 55.

Thereafter, the fluid of the ultraviolet ray curable reaction resin is subjected to a curing treatment, namely, an exposure to an ultraviolet ray. When the fluid has completely been hardened, the semiconductor device 32 is finally mounted on the wiring substrate 11. The radiation of the ultraviolet ray may be conducted every time after the individual semiconductor devices 32 have been mounted on the wiring substrate 11. Otherwise, the radiation may be achieved after when a group of the semiconductor devices 32 have been mounted on the wiring substrate 11. If the radiation can be conducted after all the semiconductor devices 32 have been mounted on the wiring substrate 11, the process can remarkably be facilitated.

It leads to a shortened duration of the process.

In the aforementioned method of mounting the semiconductor device 32, the thin film tape 53 is interposed between the ultrasonic vibrator head 44 and the semiconductor device 32 when the ultrasonic vibrator head 44 is forced to contact the semiconductor device 32. Accordingly, the thin film tape 53 is allowed to catch the overflowing fluid 35 of the ultraviolet ray curable reaction resin around the semiconductor device 32, as is apparent from FIG. 9, for example. The ultrasonic vibrator head 44 is reliably prevented from being adhered by the fluid 35 of the ultraviolet ray curable reaction resin. The ultrasonic vibrator head 44 is allowed to keep a larger contact area against the semiconductor device 32. The semiconductor device 32 is always firmly stuck on the ultrasonic vibrator head 44, so that a reliable transmission of the ultrasonic vibration can be maintained between the ultrasonic vibrator head 44 and the semiconductor device 32 in every operation. If the fluid of the ultraviolet ray curable reaction resin sticks to the ultrasonic vibrator head 44, the semiconductor device 32 sometimes fails to stick to the ultrasonic vibrator head 44, while the ultrasonic vibration sometimes cannot be transmitted to the semiconductor device 32 from the ultrasonic vibrator head 44.

The thin film tape 53 along with the fluid of the ultraviolet ray curable reaction resin is rolled up to the drive roll 54. If the thin film tape 53 is rolled up every time after the ultrasonic vibrator head 44 contacts the semiconductor device 32, the clean thin film tape 53 released from the follower roll 52 can always be disposed between the ultrasonic vibrator head 44 and the semiconductor device 32. The overflowing fluid sticking to the thin film tape 53 can reliably be collected in the drive roll 54.

Figure 10:
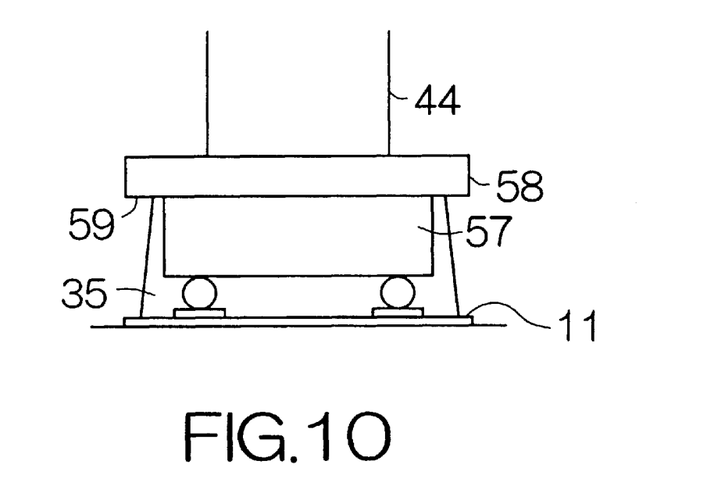
FIG. 10 schematically illustrates the function of a flange at the outer periphery of the semiconductor device.

The fluid of the ultraviolet ray curable reaction resin can be prevented from sticking to the ultrasonic vibration head 44 if a semiconductor device 57 comprises a flange 58 formed at the outer periphery of the semiconductor device 57, as shown in FIG. 10, for example. The flange 58 is designed to define a stepped surface 59 opposed to the up-faced surface of the wiring substrate 11. The stepped surface 59 of the flange 58 serves to catch the fluid 35 of the ultraviolet ray curable reaction resin overflowing out of the space between the semiconductor device 57 and the wiring substrate 11, as is apparent from FIG. 10, in the semiconductor device 57. The fluid 35 hardly flows around the flange 58 toward the ultrasonic vibrator head 44. In this manner, the ultrasonic vibrator head 44 can be prevented from contacting the overflowing fluid 35 of the ultraviolet ray curable reaction resin to the utmost.

Figure 11A:
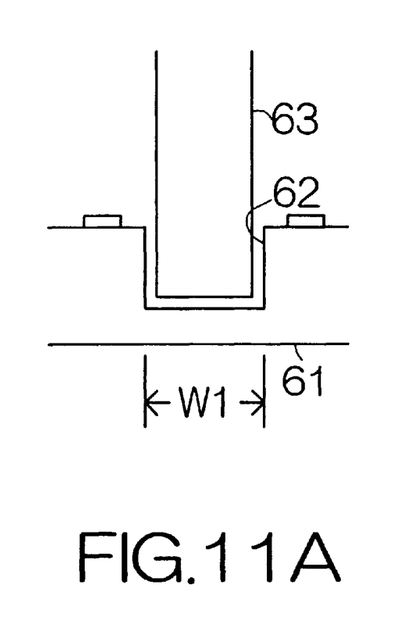
FIGS. 11A and 11B schematically illustrate the process of producing the flange on the semiconductor device.

Next, a brief description will be made on a method of producing the semiconductor device 57. First of all, a groove 62 of a first predetermined width W1 is made on the up-faced surface of a wafer 61, as shown in FIG. 11A, when the individual semiconductor device 57 is to be cut out from the wafer 61. A cutting saw 63 may be employed to make the groove 62, for example. The cutting saw 63 should have a first thickness corresponding to the first width W1.

Figure 11B:
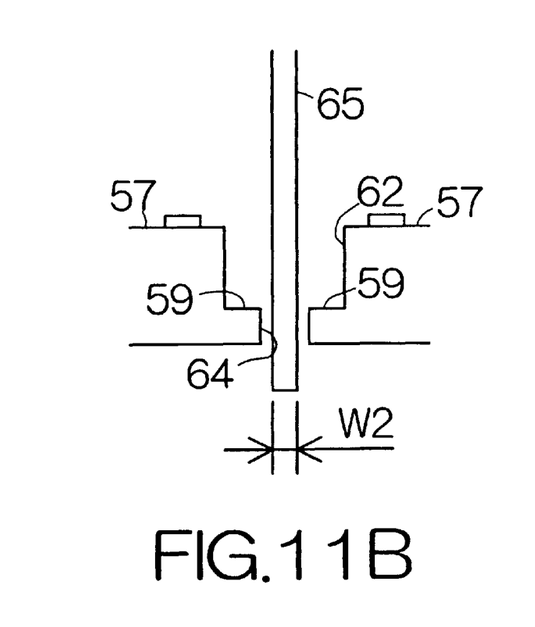

The individual semiconductor device 57 is then separated from the wafer 61. Cutting operation is conducted to make a cutting trace 64 of a second predetermined width W2 smaller than the first width W1 along the bottom of the groove 62, as shown in FIG. 11B. A cutting saw 65 may be employed to make the cutting trace 64. The cutting saw 65 should have a second thickness corresponding to the second width W1. If the cutting saw 65 is driven to follow the center line of the groove 62, stepped surfaces 59 can simultaneously be obtained on a pair of the semiconductor devices 57 on the opposite sides of the groove 62.

It should be noted that the aforementioned ultraviolet ray curable reaction resin as well as a thermosetting resin or other types of reaction resin may be selected as an underfill material in the above-described method of mounting the semiconductor device 32, 57 employing the aforementioned ultrasonic vibrator head 44.

Figure 12:
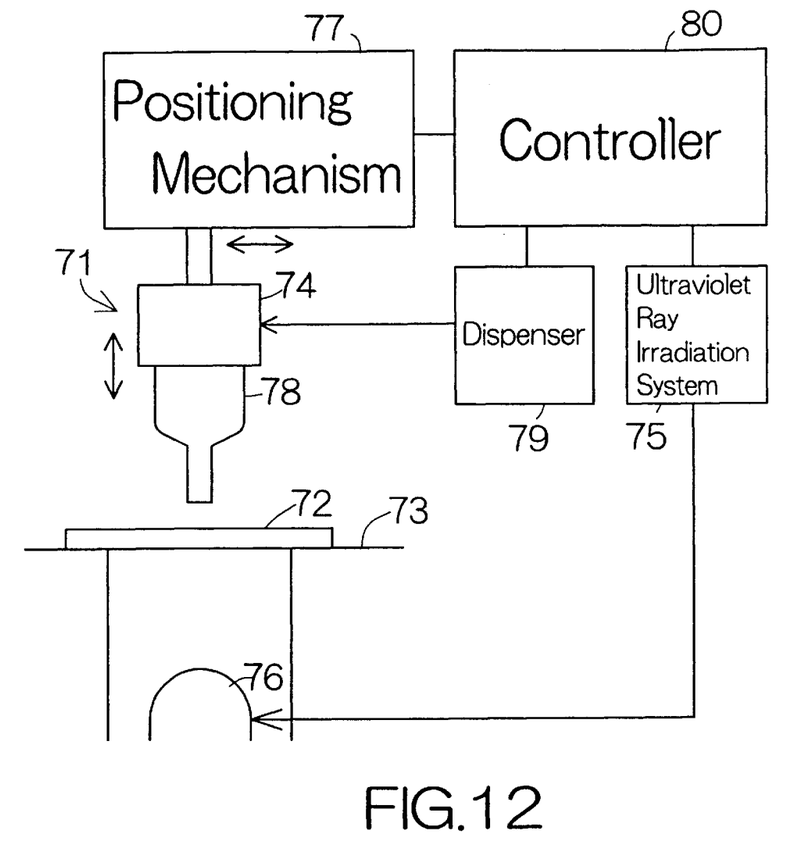
FIG. 12 is a block diagram schematically illustrating the structure of an underfilling apparatus for a semiconductor device according to a second embodiment of the present invention.

FIG. 12 schematically illustrates the entire structure of all underfilling apparatus for a semiconductor device according to a second embodiment of the present invention. The underfilling apparatus 71 includes a table 73 designed to receive a wiring substrate 72 at a horizontal plane, for example, aid a support head 74 opposed to the table 73 for movement in accordance with the three-dimensional coordinate system established on the table 73. A light source 76 of an ultraviolet ray irradiation system 75 is embedded in the table 73 under the horizontal plane. The ultraviolet ray irradiation system 75 is designed to emit an ultraviolet ray upward from a light source 76.

The coordinate system may be defined by an x-axis and a y-axis extending within the horizontal plane of the table 73, and a z-axis extending in a direction perpendicular to the horizontal plane. The movement of the support head 74 within the coordinate system may be achieved by a positioning mechanism 77, for example. The positioning mechanism 77 may include a combination of guide members for guiding movement of the support head 74 along the x-axis, y-axis and z-axis, respectively, for example.

A syringe 78 is detachably attached to the support head 74. A fluid of an underfill material, such as an ultraviolet ray curable reaction resin, for example, is contained in the syringe 78. The syringe 78 is designed to receive a pressure or a pressurized air from a dispenser 79 which is connected to the support head 74, for example. When the pressurized air is supplied to the syringe 78, the fluid of the ultraviolet ray curable reaction resin within the syringe 78 can be discharged out of the syringe 78 toward the table 73. The ultraviolet ray curable reaction resin may include one which is hardened by independent radiation of an ultraviolet ray, one which is hardened by radiation of an ultraviolet ray in combination with heat, and so on. A controller 80 is connected to the positioning mechanism 77, the dispenser 79 and the ultraviolet ray irradiation system 75 so as to control the operation of the positioning mechanism 77, the dispenser 79 and the ultraviolet ray irradiation system 75, respectively.

Figure 13:
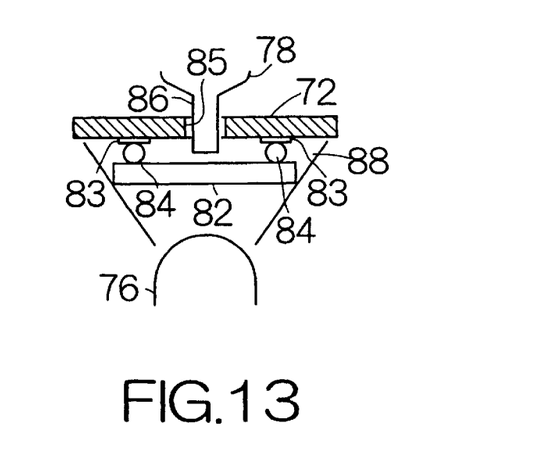
FIG. 13 schematically illustrates the process of supplying a fluid of an ultraviolet ray curable reaction resin in the underfilling apparatus of the second embodiment.

Next, description will be made on the operation of the underfilling apparatus 71. A semiconductor device 82 is first fixed on the wiring substrate 72 without underfilling the semiconductor device 82. The fixation of the semiconductor device 82 may be achieved by spherical conductive bumps 84 received on corresponding conductive input/output pads 83 over the surface of the wiring substrate 72, as shown in FIG. 13, for example. The conductive bumps 84 may include solder bumps soldered on the input/output pads 83, gold bumps fixed by the aforementioned ultrasonic vibrator head on the input/output pads 83, or the like. The conductive bumps 84 may be arranged on the rear surface of the semiconductor device 82 along the outer periphery of the semiconductor device 82.

An underfill discharge opening 85 is defined to penetrate through the wiring substrate 72. The underfill discharge opening 85 is designed to lead to the space surrounded by the conductive bumps 84 between the semiconductor device 84 and the wiring substrate 72. When the wiring substrate 72 is placed on the table 73, the semiconductor device 82 is disposed between the underfill discharge opening 85 and the light source 76 of the ultraviolet ray irradiation system 75, as is apparent from FIG. 13. Specifically, the semiconductor device 82 is held against the down-faced surface of the wiring substrate 72 so as to cover over the underfill discharge opening 85.

Thereafter, the support head 74 along with the syringe 78 is lowered while the syringe 78 is positioned relative to the wiring substrate 72 at the same time. The controller 80 is designed to supply an instructions signal to the positioning mechanism 77 so as to lower the support head 74. When the syringe 78 has reached a discharge position in this manner, the nozzle 86 at the tip end of the syringe 78 is allowed to enter the underfill discharge opening 85.

After the syringe 78 reaches the discharge position, the controller 80 instructs the dispenser 79 to start the supply of a pressurized air. The dispenser 79 is designed to discharge the pressurized air under a predetermined pressure toward the syringe 78. The fluid 88 of the ultraviolet ray curable reaction resin is consequently allowed to flow out of the tip end of the nozzle 86. The fluid 88 is supplied into the underfill discharge opening 85 through an entrance 85 defined on the up-faced surface of the wiring substrate 72. The discharged fluid 88 is received on the rear or up-faced surface of the semiconductor device 82. The space defined between the semiconductor device 82 and the down-faced surface of the wiring substrate 72 is filled with the fluid 88 of the ultraviolet ray curable reaction resin.

During the supply of the fluid 88 out of the nozzle 86, the controller 80 instructs the ultraviolet ray irradiation system 75 to continue radiation of an ultraviolet ray. The ultraviolet ray from the light source 76 is headed toward the down-faced surface of the wiring substrate 72. The overflowing fluid 88 out of the space between the semiconductor device 82 and the wiring substrate 72 is exposed to the ultraviolet ray around the outer periphery of the semiconductor device 82. The overflowing fluid is hardened to establish a dam for blocking the flow of the fluid 88 at the outer periphery of the semiconductor device 82. Accordingly, the fluid 88 can be restrained from excessive extension off the semiconductor device 82.

When the supply of the pressurized air has been terminated, the syringe 78 is allowed to rise. The controller 80 is designed to supply an instructions signal to the positioning mechanism 77 so as to lift the syringe 78. Thereafter, the continued radiation of the ultraviolet ray serves to completely cure and harden the fluid 88 of the ultraviolet ray curable reaction resin. The mounting of the semiconductor device 82 can be completed in this manner.

Figure 14:
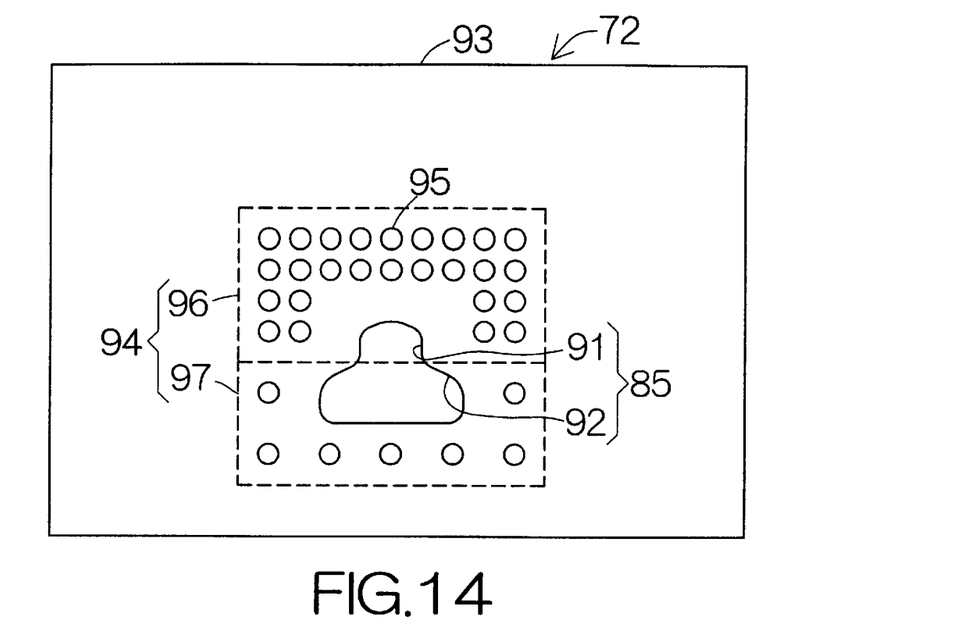
FIG. 14 is a plan view schematically illustrating the surface of the wiring substrate.

As shown in FIG. 14, the underfill discharge opening 85 defined in the wiring substrate 72 may comprise a first discharge opening 91 and a second discharge opening 92 continuous to the first discharge opening 91, for example. Specifically, a plurality of conductive input/output pads 95 are arranged over an underfill receiving region 94 defined on the surface of the substrate body 93 in the wiring substrate 72. A dense area 96 and a sparse area 97 can be defined within the underfill receiving region 94 in accordance with a specific criterion. The input/output pads 95 are congested in the dense area 96, while the input/output pads 95 are scattered in the sparse area 97. The first discharge opening 91 is located in the dense area 96 while the second discharge opening 92 is located in the sparse area 97. As is apparent from FIG. 14, the second discharge opening 92 is designed to spread over an area larger than that of the first discharge opening 91. The underfill receiving region 94 may be determined in accordance with the shape or extent of the semiconductor device 82 to be mounted on the wiring substrate 72.

Assume that a semiconductor device is to be mounted on the wiring substrate 72, conductive bumps of the semiconductor device are received on the corresponding input/output pads 95 arranged over the surface of the wiring substrate 72. In other words, the density of the conductive bumps depends on the density of the input/output pads 95. If the input/output pads 95, namely, the conductive bumps are congested, like the dense area 96, the fluid of the underfill material smoothly flows through a smaller space between the semiconductor device and the surface of the wiring substrate 72. The transfer of the fluid can be accelerated between the adjacent conductive bumps. On the other hand, even if the conductive bumps are scattered, like the sparse area 97, the second discharge opening 92 of a larger area serves to accelerate the transfer of the fluid in the space between the semiconductor device and the wiring substrate 72 without support of the conductive bumps. Without the underfill discharge opening 85, the smaller the space is defined between the semiconductor device and the wiring substrate 72, the less area the fluid spreads over.

Figure 15:
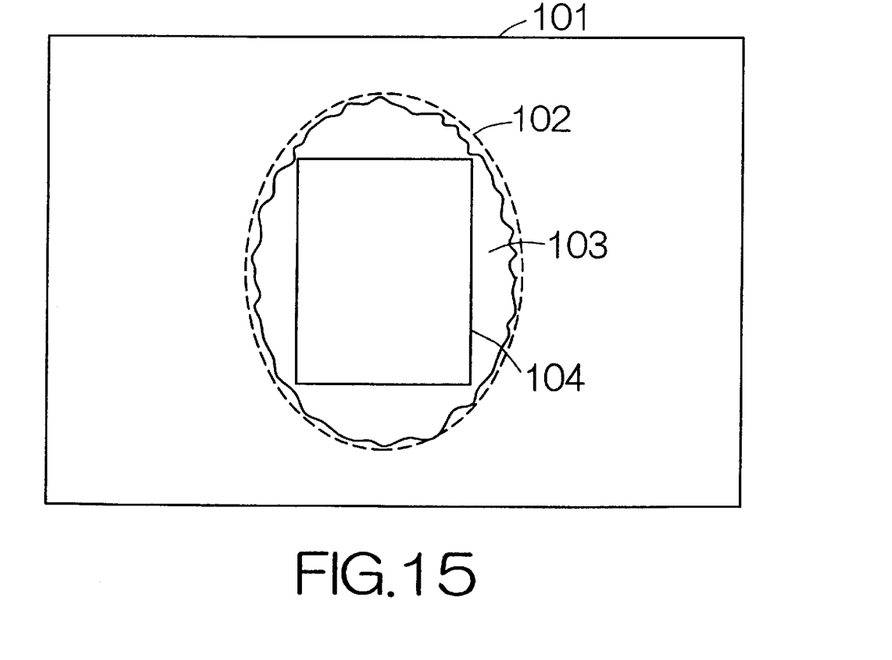
FIG. 15 is a plan view schematically illustrating the surface of the wiring substrate with irradiation of a plasma.

In any of the aforementioned method of underfilling, as shown in FIG. 15, it is preferable to subject an underfill receiving region 102 on the surface of a wiring substrate 101 to the irradiation of a plasma. The ray of the plasma serves to clean up the surface of the wiring substrate 101 so as to improve the wetness of the underfill receiving region 102. The improved wetness allows the fluid 103 of the underfill material to smoothly spread over the surface of the wiring substrate 101. If the surface force can be set larger than the interfacial force of the fluid 103 on the surface of the wiring substrate 101 at the area surrounding the underfill receiving region 102, the fluid 103 can reliably be prevented from spreading beyond the outer periphery of the underfill receiving region 102. The underfill receiving region 102 may be determined in accordance with the shape or extent of the semiconductor device 104 to be mounted on the wiring substrate 101.

What is claimed is:

1. A method of underfilling a semiconductor device, comprising:

supplying a fluid of a reaction resin from a nozzle toward a surface of a wiring substrate prior to setting of the semiconductor device upon the surface of the wiring substrate; and reducing fluidity of the fluid within the nozzle with light when a predetermined amount of the fluid has been discharged.

2. The method of underfilling according to claim 1, further comprising irradiating the fluid of the reaction resin comprising a light curable reaction resin through a transparent window defined in the nozzle.

3. A method of underfilling a semiconductor device, comprising:

holding the semiconductor device against a down-faced surface of a wiring substrate so as to cover with the semiconductor device over a discharge opening defined in the wiring substrate;

irradiating the down-faced surface of the wiring substrate; and supplying a fluid of a light curable reaction resin into the discharge opening through an entrance defined on an up-faced surface of the wiring substrate during irradiation.

4. A method of preliminary treatment for an underfill, comprising subjecting an underfill receiving region on a surface of a wiring substrate to irradiation of a plasma, while not irradiating the area of the surface surrounding the underfill receiving region.

5. A method of mounting a semiconductor device, comprising:

supplying a fluid of a reaction resin on a surface of a wiring substrate;

placing the semiconductor device on the fluid of the reaction resin over the surface of the wiring substrate;

contacting an ultrasonic vibrator against the semiconductor device on the surface of the wiring substrate; and subjecting the fluid of the reaction resin to a curing treatment.

6. The method of mounting according to claim 5, wherein a thin film is disposed between said semiconductor device and ultrasonic vibrator when said ultrasonic vibrator is contacted against the semiconductor device.

7. The method of mounting according to claim 5, said semiconductor device includes a flange formed at an outer periphery of the semiconductor device, said flange comprising a stepped surface opposed to the surface of the wiring substrate.

* * * * *